(12) United States Patent
Kim et al.

(10) Patent No.: US 7,264,008 B2
(45) Date of Patent: Sep. 4, 2007

(54) APPARATUS FOR CLEANING A WAFER

(75) Inventors: Dong-Hyun Kim, Yongin-si (KR); Sang-Ho Lee, Bucheon-si (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 629 days.

(21) Appl. No.: 10/608,074

(22) Filed: Jun. 30, 2003

(65) Prior Publication Data

US 2004/0020520 A1 Feb. 5, 2004

(30) Foreign Application Priority Data

Jul. 30, 2002 (KR) .............................. 2002-44976

(51) Int. Cl.
*B08B 3/00* (2006.01)

(52) U.S. Cl. ...................... 134/151; 134/134; 134/137; 134/140; 134/902; 134/145; 134/95.2

(58) Field of Classification Search ........ 134/133–135, 134/137, 140, 145, 902, 95.2, 151
See application file for complete search history.

(56) References Cited

U.S. PATENT DOCUMENTS

| | | | | |
|---|---|---|---|---|
| 5,779,816 A | * | 7/1998 | Trinh | 134/23 |
| 5,862,823 A | * | 1/1999 | Kamikawa et al. | 134/182 |
| 6,103,096 A | * | 8/2000 | Datta et al. | 205/686 |
| 6,115,867 A | | 9/2000 | Nakashima et al. | 15/77 |
| 6,148,463 A | | 11/2000 | Shimizu et al. | 15/102 |
| 6,357,457 B1 | | 3/2002 | Taniyama et al. | 134/57 |
| 6,516,816 B1 | * | 2/2003 | Husain et al. | 134/95.3 |
| 6,764,385 B2 | * | 7/2004 | Boumerzoug et al. | 451/39 |
| 6,874,516 B2 | * | 4/2005 | Matsuno et al. | 134/148 |
| 6,899,111 B2 | * | 5/2005 | Luscher et al. | 134/151 |

FOREIGN PATENT DOCUMENTS

| | | |
|---|---|---|
| JP | 2001-9387 | 1/2001 |
| JP | 2001009387 A * | 1/2001 |

* cited by examiner

*Primary Examiner*—Michael Barr
*Assistant Examiner*—Sarah E. Husband
(74) *Attorney, Agent, or Firm*—Lee & Morse, P.C.

(57) ABSTRACT

An apparatus for cleaning a wafer includes a plurality of holders for contacting and securing peripheral portions of a wafer, and for rotating the wafer, a first plate disposed to face a first surface of the wafer, the first plate having a plurality of first nozzles for spraying a first cleaning solution onto the first surface of the wafer, and a second plate disposed to face a second surface of the wafer that is opposite to the first surface, the second plate having a plurality of second nozzles for spraying a second cleaning solution onto the second surface of the wafer. In operation, the first and second plates and the wafer are rotated in opposite directions. The opposite rotation causes the cleaning solutions to flow abruptly thereby increasing a frictional force between the surfaces on the wafer and the cleaning solutions to improve the efficiency of the cleaning process.

30 Claims, 13 Drawing Sheets

APPARATUS FOR CLEANING A WAFER

BACKGROUND OF THE INVENTION

1. Field of the Invention

The present invention relates to an apparatus for cleaning a wafer. More particularly, the present invention relates to an apparatus for cleaning a wafer by supplying cleaning solutions onto the wafer while the wafer is rotated so that impurities remaining on the surface of the wafer are effectively removed from the wafer.

2. Description of the Related Art

Generally, semiconductor devices are manufactured by repeatedly performing a series of unit processes. These unit processes, which are performed on a semiconductor wafer, may include a film deposition process, a photolithography process, an etching process, an ion implanting process, a polishing process, a cleaning process, and a drying process. In the unit processes for manufacturing the semiconductor device, the cleaning and the drying processes are performed to remove impurities or undesired films that may have attached to the wafer, and to dry the wafer in the during the course of the other manufacturing processes, respectively. Recently, the cleaning and the drying processes have become more important as patterns formed on the wafer have become more minute and the aspect ratio of the pattern has increased.

Apparatuses for performing the cleaning process are divided into a batch-type cleaning apparatus for simultaneously cleaning a plurality of wafers, and a single-type rapid cleaning apparatus for cleaning one wafer in series. The batch-type cleaning apparatus has a cleaning bath including a cleaning solution for cleaning wafers in order to simultaneously clean the plurality of wafers. In this case, ultrasonic oscillation may be applied to the cleaning solution to increase the efficiency of the cleaning process. The single-type rapid cleaning apparatus includes a chuck for supporting a wafer and nozzles for providing the upper and the bottom surfaces of the wafer with a cleaning solution. Ultrasonic oscillation may be applied to the cleaning solution provided on the wafer. In addition, the cleaning solution applying the ultrasonic oscillation may be provided on the wafer.

The wafer cleaning apparatus can be variably employed according to a particular unit process, such as a film deposition process, an etching process, or a polishing process. That is, various wafer cleaning apparatuses may be used for the different unit processes.

Among the unit processes, a polishing process is performed to planarize the surface of the wafer, and a chemical-mechanical polishing (CMP) method using slurry is the most commonly adopted polishing process. The impurities, such as slurry and polished by-products, remain on the surface of the wafer after the CMP process is performed on the wafer. The impurities are generally removed from the wafer through a cleaning process performed after the CMP process.

A wafer treated by the CMP process is conventionally cleaned through a first cleaning process using de-ionized water, a second cleaning process using an ammonia solution ($NH_4OH$), a third cleaning process using a hydrofluoric (HF) solution, a rinsing process using de-ionized water, and a drying process.

In the first cleaning process, the impurities on the wafer are removed from the wafer by applying de-ionized water on the wafer while the wafer rotates. At that time, a roller brush may be employed to remove the impurities on the wafer.

In the second cleaning process, the ammonia solution is sprayed on the wafer, and the roller brush is used to clean the wafer by applying a frictional force between the roller brush and the wafer during the rotation of the wafer. The slurry and the polished by-product remaining on the wafer change a property of the surface of the wafer into a hydrophobic characteristic. The ammonia solution changes the surface characteristic of the wafer from hydrophobic to hydrophilic.

In the third cleaning process, when the wafer rotates, the hydrofluoric solution is sprayed on the wafer, and the roller brush is employed to clean the wafer by applying a frictional force between the roller brush and the wafer. The slurry and the polished by-product remaining on the wafer are removed by a reaction including the hydrofluoric solution, the slurry and the polished by-product.

In the rinsing process, a rinsing solution is provided on the wafer while the wafer rotates.

In the drying process, the wafer is rotated in order to dry. During the drying process, the wafer may be heated using an infrared lamp. The rotational speed of the wafer is gradually increased to allow the centrifugal force caused by the rotation of the wafer to remove any moisture remaining on the wafer.

The second and the third cleaning processes may include additional rinsing steps for removing the ammonia solution and the hydrofluoric solution remaining on the surface of the wafer.

The wafer cleaning apparatus for performing the above cleaning processes typically includes a first cleaning part for performing the first cleaning process, a second cleaning part for performing the second cleaning process, a third cleaning part for performing the third cleaning process, a rinsing part for performing the rinsing process, and a drying part for performing the drying process. Hence, the time required for cleaning the wafer may significantly increase because the wafer must be transferred through several parts during the cleaning processes. Moreover, the wafer cleaning apparatus including each of those several parts has too large of a volume to be practical. Furthermore, the roller brush employed for cleaning the wafer may cause damage to the wafer, such as a scratch, during the cleaning processes.

SUMMARY OF THE INVENTION

In order to overcome at least some of the above-mentioned problems, it is a first feature of an embodiment of the present invention to provide an apparatus for cleaning a wafer that can improve the efficiency of a cleaning process by increasing a frictional force between cleaning solutions and surfaces of the wafer after uniformly spraying the cleaning solutions onto the entire surfaces of the wafer.

It is a second feature of an embodiment of the present invention to provide an apparatus for cleaning a wafer that can enhance the efficiency of a drying process by uniformly providing drying gases over entire surfaces of the wafer.

In order to provide the above features of the present invention, a preferred embodiment of the present invention provides an apparatus for cleaning a wafer including a plurality of holders for contacting and securing peripheral portions of a wafer, and for rotating the wafer, a first plate disposed to face a first surface of the wafer, the first plate having a plurality of first nozzles for spraying a first cleaning solution onto the first surface of the wafer; and a second plate disposed to face a second surface of the wafer that is opposite to the first surface, the second plate having a plurality of second nozzles for spraying a second cleaning solution onto the second surface of the wafer.

To provide the features of the present invention, another preferred embodiment of the present invention includes a plurality of holders for gripping peripheral portions of a wafer; a first plate disposed to face a first surface of the wafer, the first plate having a disc shape corresponding to a shape of the wafer and a plurality of first nozzles for spraying a first cleaning solution on the first surface of the wafer; a second plate disposed to face a second surface of the wafer that is opposite to the first surface of the wafer, the second plate having a disc shape corresponding to a shape of the wafer and a plurality of second nozzles for spraying a second cleaning solution on the second surface of the wafer; a first driving part connected to the first plate for rotating the first plate in a first direction; a second driving part connected to the second plate for rotating the second plate in the first direction; a third driving part connected to the plurality of holders for rotating the wafer secured by the plurality of holders in a second direction, which is opposite to the first direction; and a fourth driving part for swinging the plurality of holders toward the peripheral portions of the wafer so that the plurality of holders can contact and secure the peripheral portions of the wafer.

To provide the features of the present invention, still another preferred embodiment of the present invention provides an apparatus for cleaning a wafer including a first plate having a plurality of first nozzles for spraying a first cleaning solution onto a first surface of a wafer; a plurality of holders for contacting and securing peripheral portions of the wafer to face the first plate, and for rotating the wafer; a second plate having a plurality of second nozzles for spraying a second cleaning solution onto a second surface of the wafer, the second plate being disposed to face the second surface of the wafer; a first driving part connected to the plurality of holders for swinging the plurality of holders toward the peripheral portions of the wafer so that the plurality of holders can contact and secure the peripheral portions of the wafer; a second driving part connected to the first driving part for rotating the wafer secured by the plurality of holders; transferring means for transferring the wafer treated with the first and the second cleaning solutions into a wafer cassette; and a cassette stage for supporting the wafer cassette.

According to the various embodiments of the present invention, the cleaning efficiency of the wafer may be improved because the first and the second cleaning solutions are uniformly sprayed onto the entire surfaces of the wafer. In addition, because the first and the second plates rotate in a direction opposite to the direction of rotation of the wafer, the first and the second cleaning solutions flow more abruptly on the first and the second surfaces of the wafer causing a frictional force between the cleaning solutions and the surfaces to increase. As a result, the cleaning efficiency is improved, and the time required for cleaning the wafer is reduced.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-44976, filed on Jul. 30, 2002, and entitled: "Apparatus for Cleaning a Wafer," is incorporated by reference herein in its entirety.

The present invention will now be described more fully hereinafter with reference to the accompanying drawings, in which preferred and alternate embodiments of the present invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
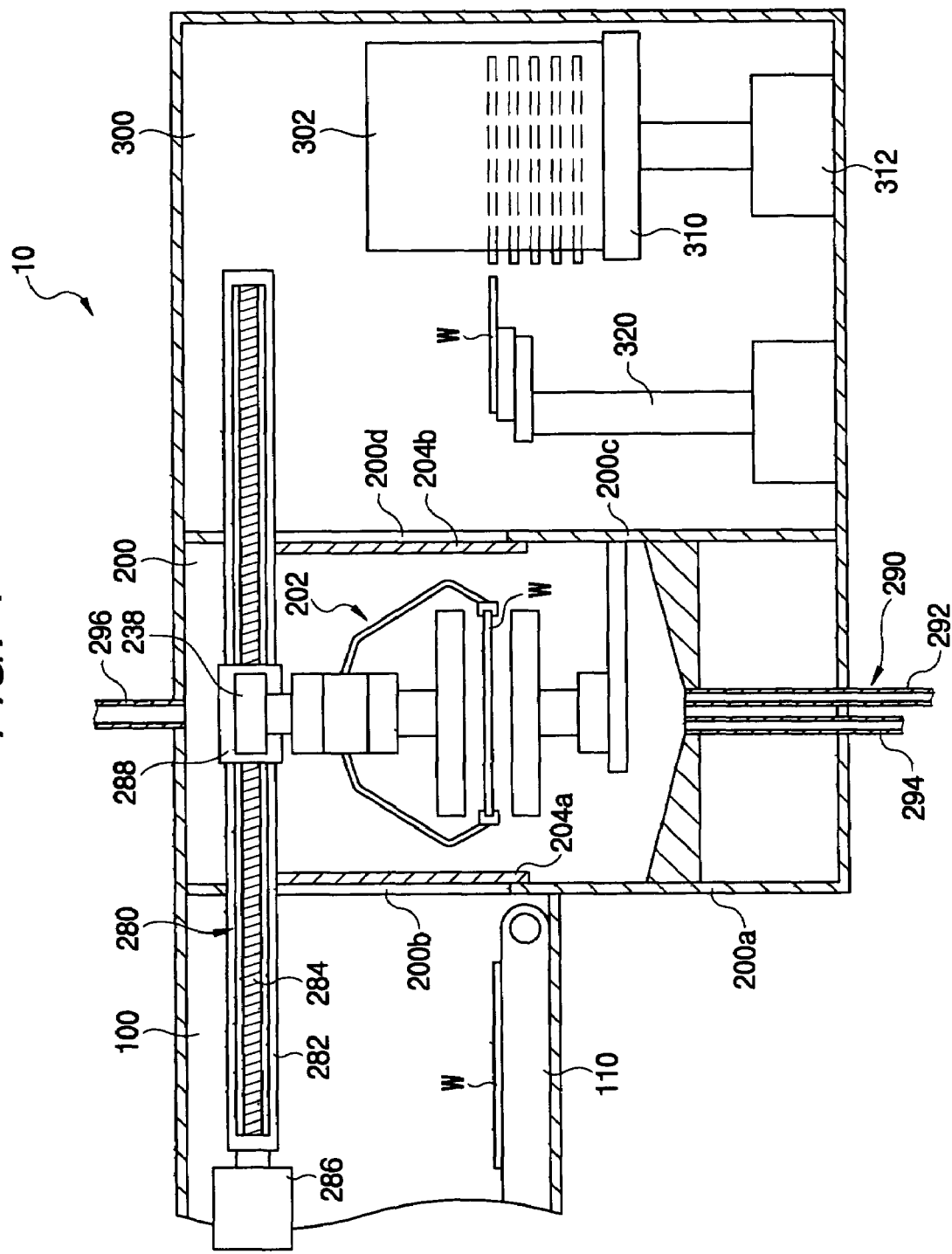
FIG. 1 illustrates a schematic cross-sectional view of an apparatus for cleaning a wafer according to a preferred embodiment of the present invention.

FIG. 1 illustrates a schematic cross-sectional view of an apparatus for cleaning a wafer according to a preferred embodiment of the present invention.

Referring to FIG. 1, a wafer cleaning apparatus 10 includes a wafer load chamber 100, a processing chamber 200, and a wafer unload chamber 300. A wafer W is shown at various stages in the process in each of the chambers.

In operation, a wafer W is cleaned and dried in the processing chamber 200. Then, the cleaned and dried wafer W is unloaded in the wafer unload chamber 300.

The wafer load chamber 100 includes a wafer conveyer 110 for transferring the wafer W subjected to a chemical-mechanical polishing (CMP) process. The processing chamber 200 includes a wafer treatment member 202. The wafer unload chamber 300 includes a cassette stage 310 and a transferring robot 320. A wafer cassette 302 for receiving the cleaned and dried wafer W is positioned on the cassette stage 310. The transferring robot 320 transfers the cleaned and dried wafer W into the wafer cassette 302.

Figure 2:
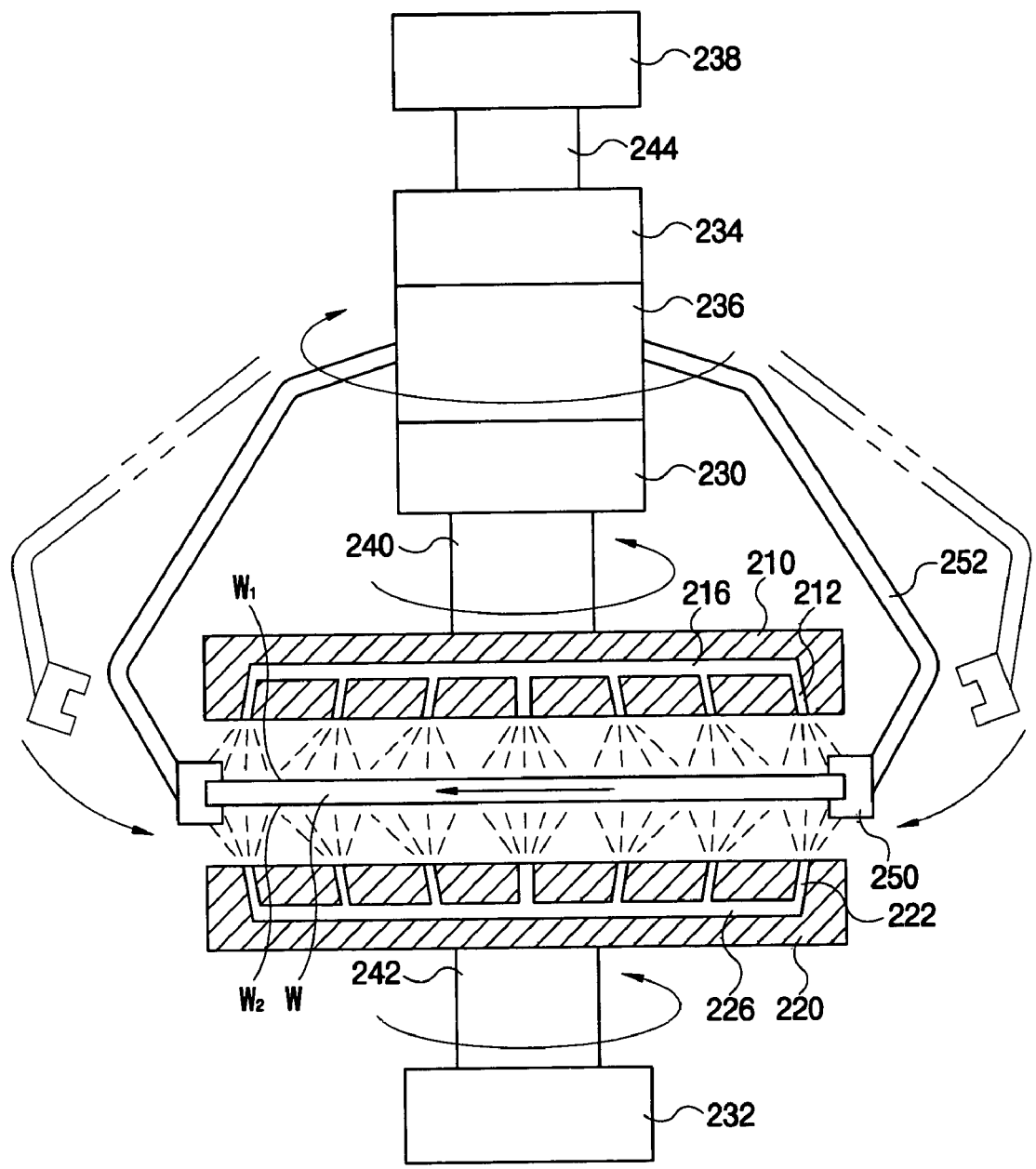
FIG. 2 illustrates an enlarged cross-sectional view of the wafer treatment member as shown in FIG. 1.

FIG. 2 illustrates an enlarged cross-sectional view of the wafer treatment member 202 as shown in FIG. 1.

Referring to FIGS. 1 and 2, the wafer treatment member 202 includes a plurality of holders 250, a first plate 210, a second plate 220, a first driving part 230, a first driving shaft 240, a second driving part 232, a second driving shaft 242, a third driving part 234, a third driving shaft 244, a fourth driving part 236, a plurality of connecting rods 252, a fifth driving part 238, a sixth driving part 280, and a seventh driving part 312.

The holders 250 contact and secure peripheral portions of the wafer W. The first plate 210 supplies a first surface $W_1$ of the wafer W with a first cleaning solution. The first plate 210 faces the first surface $W_1$ of the wafer W secured by the holders 250. The second plate 210 supplies a second surface $W_2$ of the wafer W with a second cleaning solution. The second plate 220 faces the second surface $W_2$ of the wafer W secured by the holders 250.

The first driving part 230 for rotating the first plate 210 is disposed over the first plate 210. The first driving part 230 provides the first plate 210 with a first driving force for rotating the first plate 210. The first driving part 230 and the first plate 210 are connected by the first driving shaft 240. The second driving part 232 for rotating the second plate 220 is disposed under the second plate 220. The second driving part 232 provides the second plate 220 with a second driving force for rotating the second plate 220. The second driving shaft 242 connects the second plate 220 to the second driving part 232. The third driving part 234 for rotating the wafer W secured by the holders 250 is disposed over the first driving part 230. The third driving part 234 provides a third driving force for rotating the wafer W. The fourth driving part 236 is disposed between the first driving part 230 and the third driving part 234 such that the fourth driving part 236 connects the third driving part 234 to the first driving part 230. In addition, the fourth driving part 236 swings the holders 250 in an upward direction and a downward direction so that the holders 250 can contact and secure the peripheral portions of the wafer W. The fourth driving part 236 and the holders 250 are connected by the connecting rods 252. The fifth driving part 238 for adjusting heights of the first plate 210 and the holders 250 is disposed over the third driving part 234. The third driving shaft 244 connects the fifth driving part 238 to the third driving part 234.

The first plate 210 includes a first passage 216 formed therein, and a plurality of first nozzles 212 formed from a bottom surface of the first plate 210 to the first passage 216. The first cleaning solution is sprayed onto the first surface $W_1$ of the wafer W through the first passage 216 and the first nozzles 212.

The second plate 220 includes a second passage 226 formed therein, and a plurality of second nozzles 222 formed from an upper surface of the second plate 220 to the second passage 226. The second cleaning solution is sprayed onto the second surface $W_2$ of the wafer W through the second passage 226 and the second nozzles 222.

Examples of the first and the second cleaning solutions include de-ionized water, an ammonia solution, a hydrogen fluoride solution, or the like. Preferably, first and second cleaning solutions including identical components are applied to the first and the second surfaces $W_1$ and $W_2$ of the wafer W, respectively. Alternately, the first cleaning solution may be different from the second cleaning solution, in accordance with processing conditions of a particular cleaning process.

As shown in FIG. 2, the wafer W secured by the holders 250 may be rotated clockwise by the third driving part 234 while the first and the second plates 210 and 220 may be rotated counter-clockwise by the first and the second driving parts 230 and 232, respectively. However, the wafer W, the first plate 210 and the second plate 220 may each rotate in an opposite direction. That is, when the wafer W is rotated counter-clockwise, the first and the second plates 210 and 220 are rotated clockwise. Exemplary rotational movements of the wafer W, the first plate 210 and the second plate 220 are shown as arrows in FIG. 2.

The first and the second cleaning solutions are provided onto the first and the second surfaces $W_1$ and $W_2$ of the wafer W, respectively, such that spiral flows of the first and the second cleaning solutions turning toward the peripheral portion of the wafer W are generated due to the rotation of the wafer W. The flows of the first and the second cleaning solutions can more efficiently remove impurities from the first and the second surfaces $W_1$ and $W_2$ of the wafer W. When the rotations of the first and the second plates 210 and 220 are opposite of the rotation of the wafer W, the flows of the first and the second cleaning solutions accelerate so that the cleaning efficiency of the wafer W increases. That is, the frictional force between the surfaces $W_1$ and $W_2$ of the wafer W and the cleaning solutions increases as the flow velocity of the first and the second cleaning solutions accelerate while the first and the second cleaning solutions are sprayed onto the first and the second surfaces $W_1$ and $W_2$ of the wafer W, thereby improving the cleaning efficiency of the wafer W.

When the first and the second cleaning solutions include de-ionized water, the frictional force between the surfaces $W_1$ and $W_2$ and the cleaning solutions increases so that impurities, like particles, can be more efficiently removed from the wafer W. When the first and the second cleaning solutions include chemicals, the increased frictional force can accelerate the reaction between the slurry and the polished by-products remaining on the wafer W, thereby enhancing the cleaning efficiency of the wafer W. In addition, the first and the second cleaning solutions can ensure the high cleaning efficiency of the wafer W when an undesired film, like a native oxide, is removed from the wafer W.

The distance interval between the first and the second plates 210 and 220 is adjusted by the fifth driving part 238. The heights of the connecting rods 252 connected to the fourth driving part 236 determine the distance interval between the first plate 210 and the wafer W and the distance interval between the wafer W and the second plate 220. The heights of the connecting rods 252 may either be freely adjustable by the fourth driving part 236 or the heights of the connecting rods 252 may be fixed. That is, depending on the type of cleaning solutions, the pressure for supplying the cleaning solutions, and the cross-sectional areas of the first and the second nozzles, the distance interval between the first plate 210 and the wafer W and the distance interval between the wafer W and the second plate 220 may be adjusted.

The first plate preferably has a disc shape corresponding to a shape of the wafer W and the second plate 220 has a shape identical to that of the first plate 210. Thus, a detailed description of the second plate 220 having the same shape as the first plate 210 will be omitted after the following description of the first plate 210.

Figure 3:
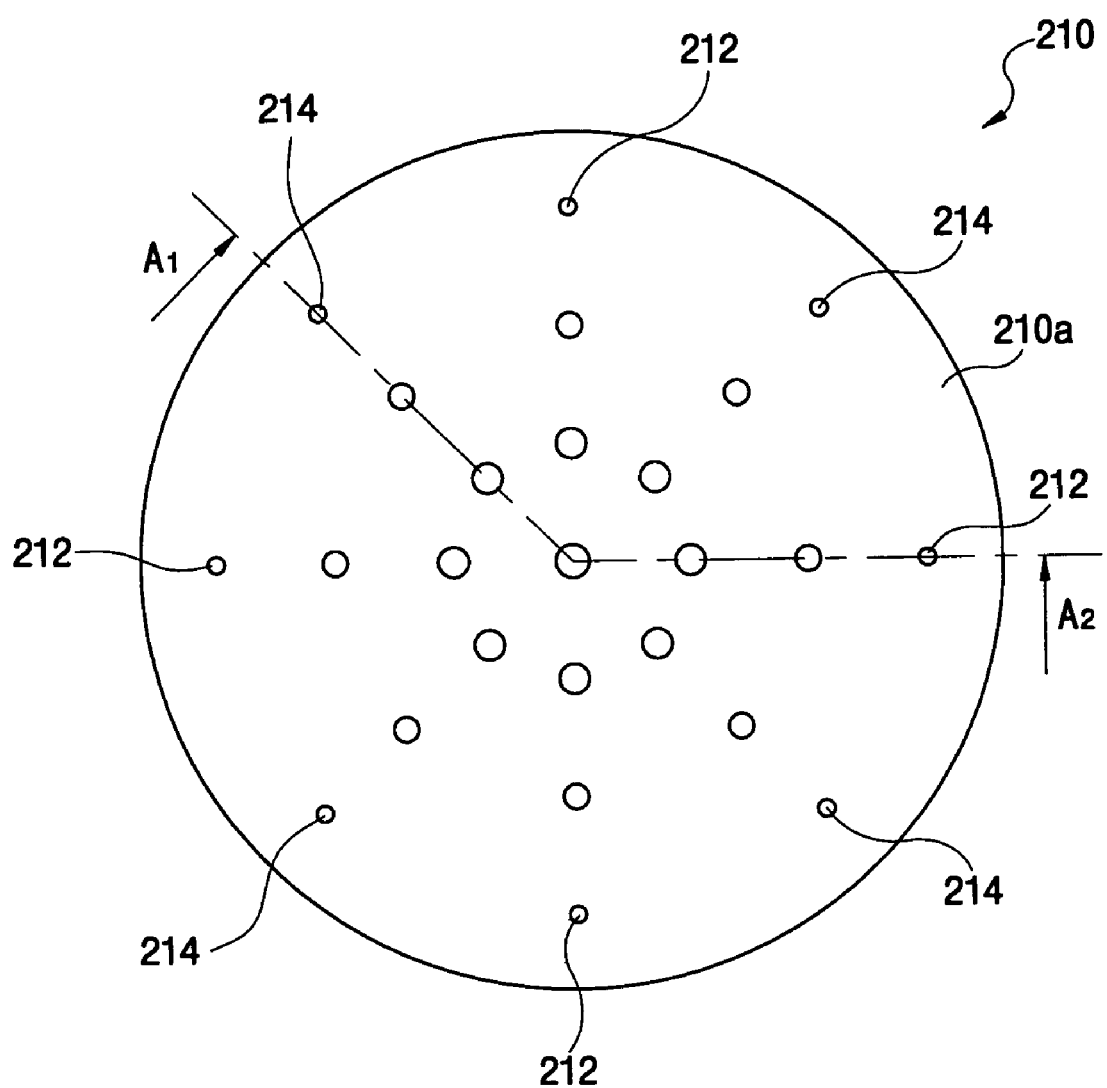
FIG. 3 illustrates a plan view of FIG. 2.

FIG. 3 illustrates a plan view of FIG. 2.

Referring to FIGS. 2 and 3, a plurality of first nozzles 212 for supplying the first cleaning solution onto the first surface W₁ of the wafer W are formed through the bottom surface 210a of the first plate 210. The first nozzles 212 are radially disposed at an angle of approximately 90°. The cross-sectional areas of the first nozzles 212 are gradually reduced from a first nozzle formed at a central portion of the first plate 210 to a first nozzle formed at a peripheral portion of the first plate 210. Hence, the flow velocity of the first cleaning solution sprayed from the first nozzles 212 increases from the central portion of the first plate 210 to the peripheral portion of the first plate 210, thereby further enhancing the cleaning efficiency of the wafer W. Preferably, the diameters of the first nozzles 212 are approximately 2 mm, approximately 1.8 mm, approximately 1.5 mm and approximately 1 mm, respectively, from the central portion of the first plate 210 to the peripheral portion of the first plate 210. Alternately, the diameters of the first nozzles 212 may be varied according to the pressure for supplying the first cleaning solution and the distance interval between the first plate 210 and the wafer W. Preferably, a pressure for supplying the first cleaning solution is about 3 to 5 kg/cm² and the distance interval between the first plate 210 and the wafer W is about 5 to 10 cm.

In addition to the plurality of first nozzles 212, a plurality of third nozzles 214 are formed through the bottom surface 210a of the first plate 210 in order to spray a first drying gas onto the first surface W₁ of the wafer W. The first drying gas dries the first surface W₁ of the wafer W after the first surface W₁ of the wafer W has been cleaned with the first cleaning solution. The third nozzles 214 are radially disposed at an angle of approximately 90°, and the cross-sectional areas of the third nozzles 214 are reduced from the central portion of the first plate 210 toward the peripheral portion of the first plate 210. As shown in FIG. 3, the first nozzles 212 and the third nozzles 214 are alternately, radially disposed at an angle of approximately 45°. Preferably, the shapes of the third nozzles 214 are identical to those of the first nozzles 212. The third nozzles 214 having the above-described constructions are able to uniformly provide the entire first surface W₁ of the wafer W with the first drying gas.

In the second plate 220, a plurality of second nozzles 222 are formed through the upper surface of the second plate 220 so as to spray the second cleaning solution onto the second surface W₂ of the wafer W. In addition, a plurality of fourth nozzles (not shown) for spraying a second drying gas onto the second surface W₂ of the wafer W are formed through the upper surface of the second plate 220. The second and the fourth nozzles 222 have an identical arrangement and shape to those of the first and the third nozzles 212 and 214, respectively.

The first and the second drying gases may include a heated nitrogen gas or an isopropyl alcohol vapor.

Figure 4:
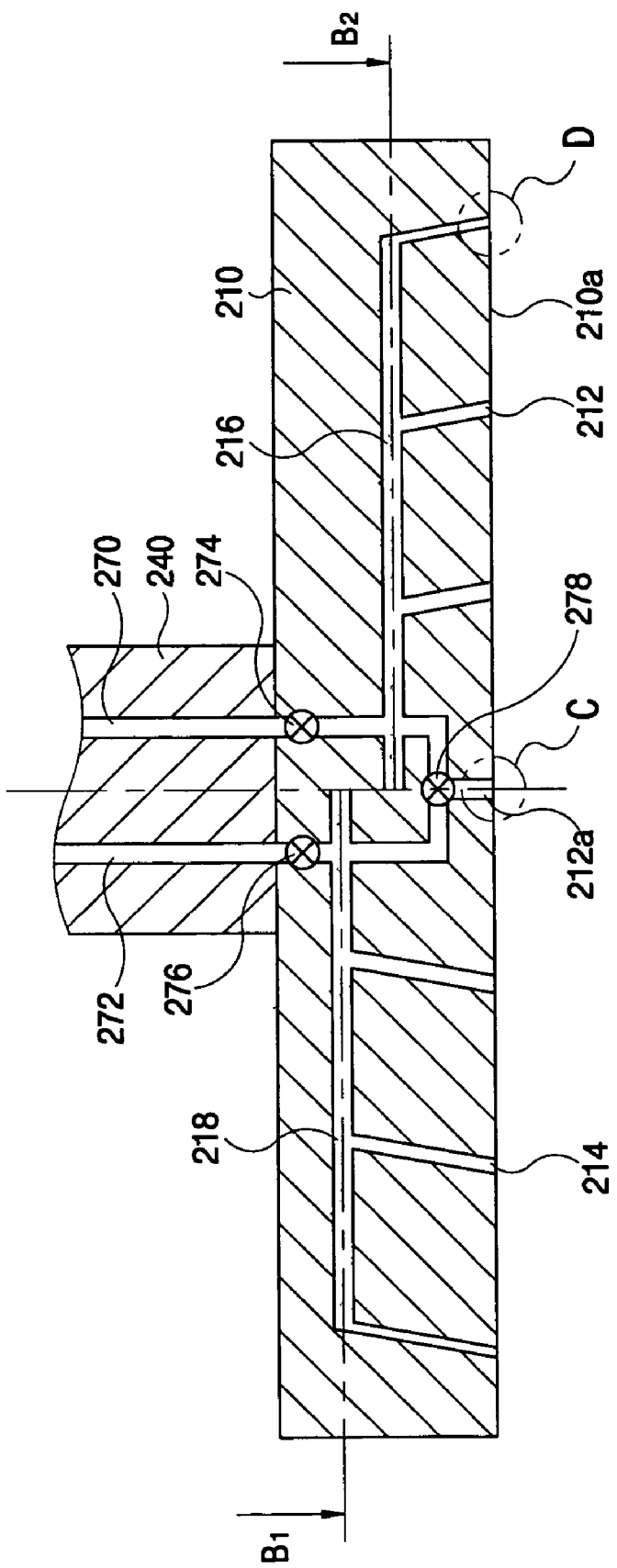
FIG. 4 illustrates an enlarged cross-sectional view of the first plate taken along line $A_1$-$A_2$ in FIG. 3.
Figure 5:
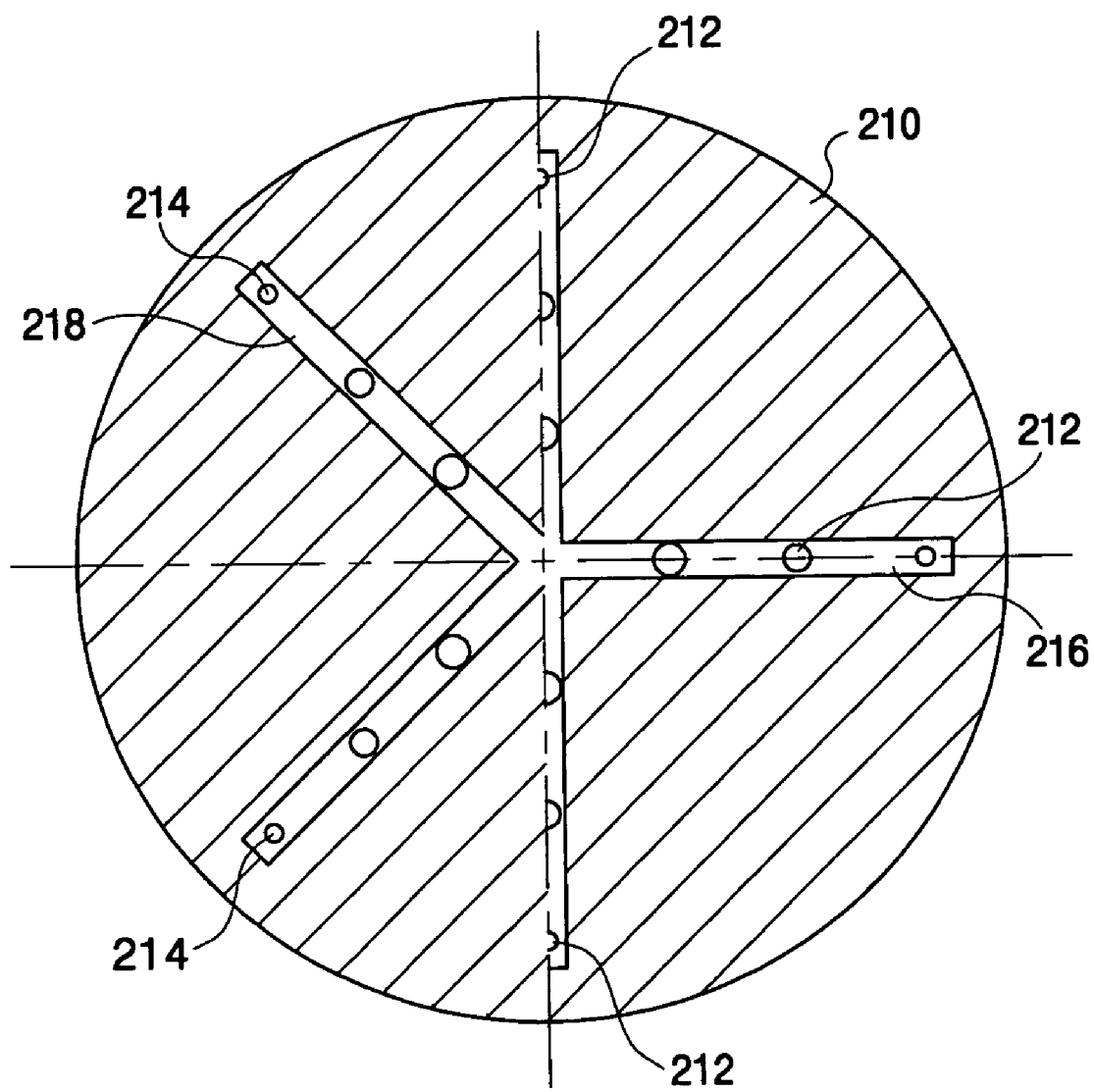
FIG. 5 illustrates an enlarged cross-sectional view of the first plate taken along line $B_1$-$B_2$ in FIG. 4.
Figure 6:
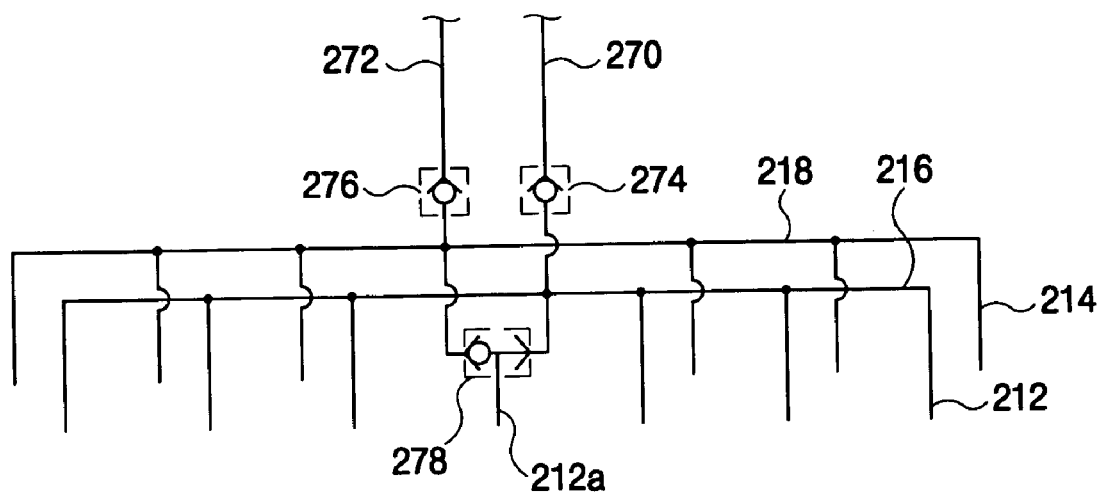
FIG. 6 illustrates a schematic plan view of the first passage and the third passage formed in the first plate as shown in FIG. 4.

FIG. 4 illustrates an enlarged cross-sectional view of the first plate taken along line A₁-A₂ in FIG. 3. FIG. 5 illustrates an enlarged cross-sectional view of the first plate taken along line B₁-B₂ in FIG. 4. FIG. 6 illustrates a schematic plan view of the first passage and the third passage formed in the first plate as shown in FIG. 4.

Referring to FIGS. 4 to 6, the first passage 216 and a third passage 218 are radially formed in the first plate 210. The first passage 216 supplies the first cleaning solution. The third passage 218 supplies the first drying gas. The first passage 216 is connected to a first cleaning solution supplying line 270. The first cleaning solution and the first drying gas supplying lines 270 and 272, respectively, extend through the first driving shaft 240. A first check valve 274 is installed in the first cleaning solution supplying line 270 to prevent backflow of the first cleaning solution. A third check valve 276 is installed in the first drying gas supplying line 272 to prevent backflow of the first drying gas.

The first passage 216 is disposed lower than the third passage 218 so that the third passage 218 does not obstruct the first passage 216. The first nozzles 212 are divided from the first passage 216 and then extended to the bottom surface 210a of the first plate 210. The third nozzles 214 are divided from the third passage 218 and then extended to the bottom surface 210a of the first plate 210. A central first nozzle 212a, positioned at the central portion of the first plate 210, is connected to both the first and the third passages 216 and 218 through a first shuttle valve 278. That is, the central first nozzle 212a formed at the central portion of the first plate 210 supplies the first cleaning solution onto the wafer W during the cleaning process and the central first nozzle 212a provides the first drying gas onto the wafer W during a drying process. The first shuttle valve 278 is a flow control valve having two inflow ports and one outflow port. More specifically, the first shuttle valve 278 corresponds to a converting valve always passing the fluid having a relatively high pressure by opening one port of the two inflow ports having the relatively high pressure, and by closing another port of the two inflow ports having a relatively low pressure.

Though it is not illustrated, the second plate 220 has an identical configuration to the first plate 210, as described above. Similarly, the second plate 220 includes the second passage 226 and a fourth passage (not shown) formed therein. The second passage 226 is connected to a second cleaning solution supplying line. The fourth passage is connected to a second drying gas supplying line. A second check valve is installed in the second cleaning solution supplying line to prevent the backflow of the second cleaning solution. A fourth check valve is installed in the second drying gas supplying line to prevent the backflow of the second drying gas. A central second nozzle 222a, formed at the central portion of the second plate 220, is connected to both the second cleaning solution and the second drying gas supplying lines through a second shuttle valve.

Figure 7:
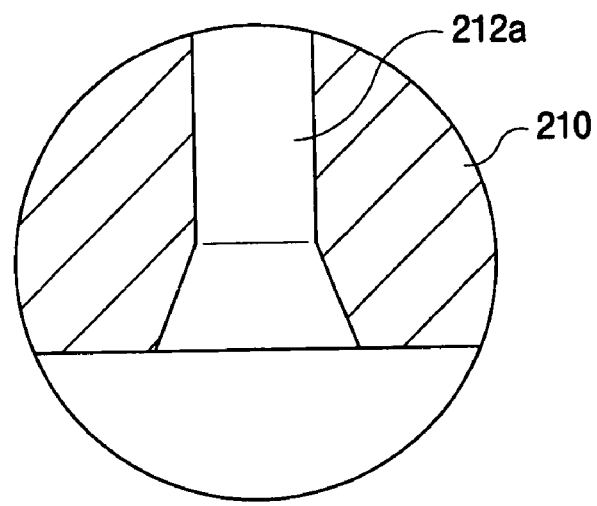
FIG. 7 illustrates an enlarged cross-sectional view of a portion 'C' in FIG. 4.
Figure 8:
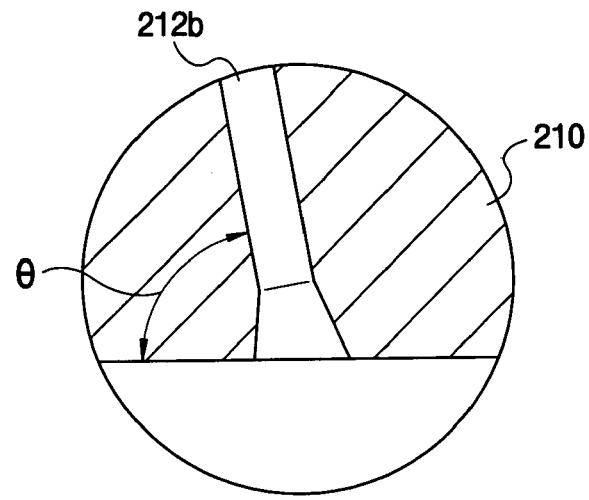
FIG. 8 illustrates an enlarged cross-sectional view of a portion 'D' in FIG. 4.

FIG. 7 illustrates an enlarged cross-sectional view of a portion 'C' in FIG. 4. FIG. 8 illustrates an enlarged cross-sectional view of a portion 'D' in FIG. 4.

Referring to FIGS. 7 and 8, the central first nozzle 212a is positioned at the central portion of the first plate 210, and another one of the plurality of first nozzles 212b is disposed at a peripheral portion of the first plate 210. The central first nozzle 212a in FIG. 7 is formed perpendicular to the wafer W. The cross-sectional area of the central first nozzle 212a is increased toward the wafer W in a longitudinal direction in order to augment the spray angle of the first cleaning solution.

The one of the plurality of first nozzles 212b shown in FIG. 8 is formed at a slant with respect to the first surface W₁ of the wafer W at an angle of approximately 80°. The slant smoothes for smoothing the flow of the first cleaning solution applied onto the first surface W₁ of the wafer W. In addition, the cross-sectional area of the first nozzle 212b is increased toward the wafer W in a longitudinal direction to increase the spray angle of the first cleaning solution. In this case, the first nozzle 212b in FIG. 8 is inclined toward the peripheral portion of the wafer W.

As shown in FIG. 4, the plurality of first nozzles 212b formed away from the central portion of the first plate 210 are also formed at a slant with respect to the first surface W₁ of the wafer W at an angle of approximately 80°. The central first nozzle 212a, however, is not formed at a slant. The angle of inclination of the plurality of first nozzles that are formed at a slant is not limited to the angle of 80°. The angle of inclination of the plurality of first nozzles may be varied in accordance with the distance interval between the first plate 210 and the wafer W and the pressure for supplying the first cleaning solution.

Though the plurality of first nozzles 212 are shown and described in detail, the second nozzles 222, the third nozzles 214, and the fourth nozzles have identical structures to those of the first nozzles 212. Accordingly, a description of the structures and arrangements of the second through fourth nozzles will be omitted.

In view of the above-described configuration, the first and the second cleaning solutions are uniformly applied onto the first and the second surfaces $W_1$ and $W_2$ of the wafer W, respectively. In addition, the first and the second cleaning solutions actively flow on the first and the second surfaces $W_1$ and $W_2$ in accordance with the rotations of the wafer W, the first plate 210, and the second plate 220.

Figure 9:
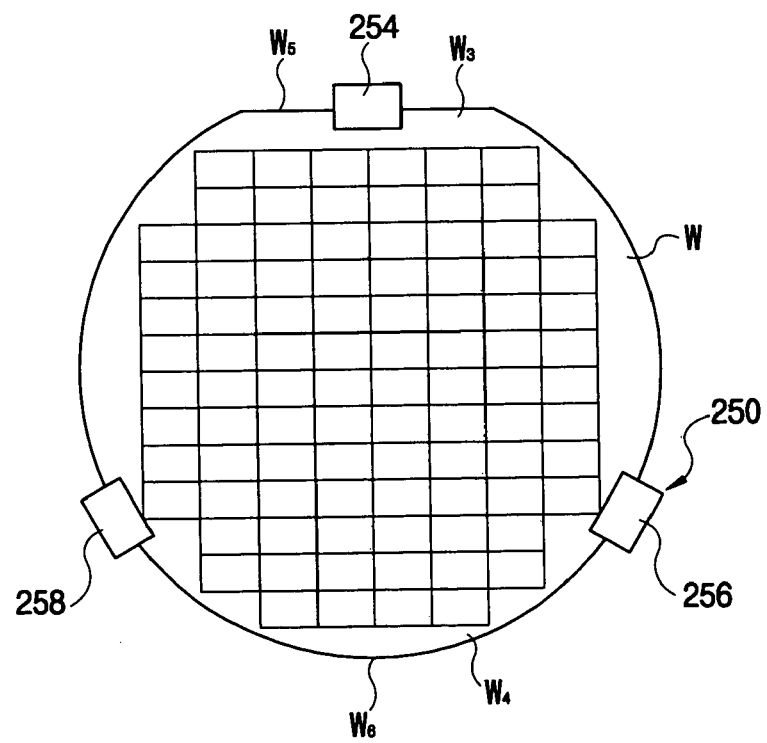
FIG. 9 illustrates a plan view of the wafer and holders as shown in FIG. 2.
Figure 10:
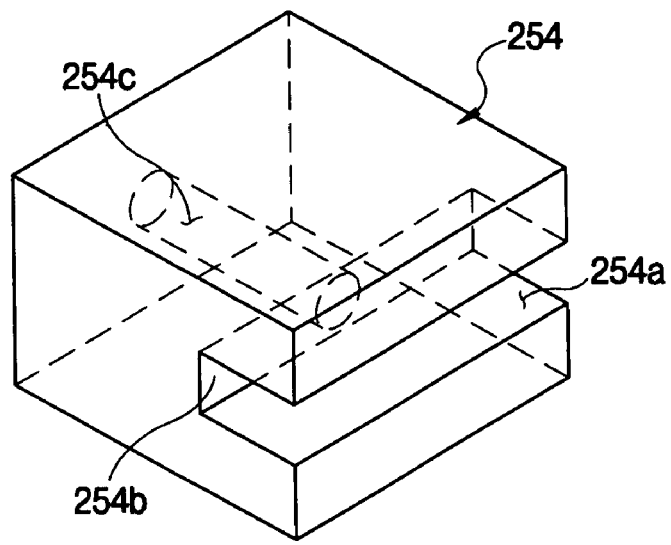
FIG. 10 illustrates an elevated, perspective view of the first holder as shown in FIG. 9.
Figure 11:
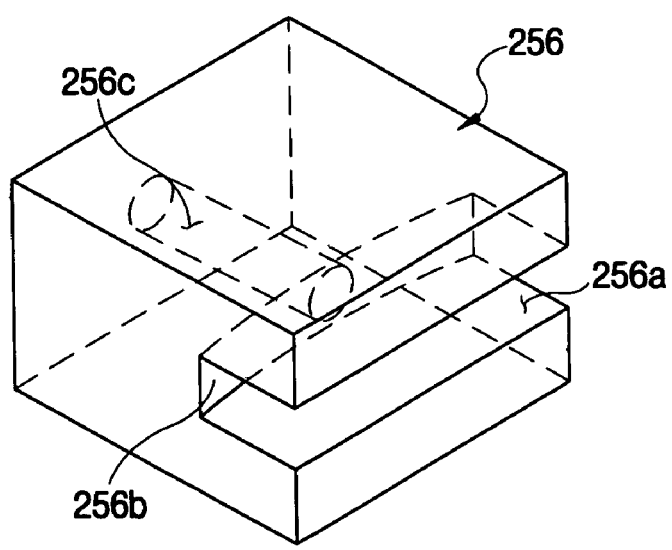
FIG. 11 illustrates an elevated, perspective view of the second holder as shown in FIG. 9.

FIG. 9 illustrates a plan view of the wafer W and the holders 250 as shown in FIG. 2. FIG. 10 illustrates an elevated, perspective view of the first holder 254 as shown in FIG. 9. FIG. 11 illustrates an elevated, perspective view of the second holder 256 as shown in FIG. 9.

Referring to FIGS. 9 to 11, three holders 254, 256 and 258 contact and secure the wafer W. The first holder 254 contacts a flat zone portion $W_3$ of the wafer W. The second holder 256 and a third holder 258 contact circumferential portions $W_4$ of the wafer W. In this arrangement, the second holder 256 and the third holder 258 have an identical shape. Though the wafer W is secured by an exemplary three holders 254, 256 and 258, as shown in FIG. 9, the actual number of the holders 250 may be varied.

Referring now to FIGS. 9 and 10, the first holder 254 faces a first side surface $W_5$ of the wafer W adjacent to the flat zone portion $W_3$, and includes a first gripping groove 254a corresponding to the first side surface $W_5$ of the wafer W. A first draining hole 254c is formed at an interior portion 254b of the first gripping groove 254a facing the first side surface $W_5$ of the wafer W. The first draining hole 254c penetrates the first holder 254 in a radial direction with respect to the wafer W. The first and the second cleaning solutions are employed on the first and the second surfaces $W_1$ and $W_2$ of the wafer W, respectively, and then the first and the second cleaning solutions flow toward the peripheral portion of the wafer W due to the rotation of the wafer W, so the first and the second cleaning solutions are dispersed from the peripheral portion of the wafer W. At that time, the first and second cleaning solutions moving toward the first holder 254 are discharged to the outside through the first draining hole 254c.

Referring now to FIGS. 9 and 11, a second gripping groove 256a is formed in the second holder 256 facing a second side surface $W_6$ of the wafer W adjacent to the circumferential portion $W_4$ of the wafer W. The second gripping groove 256a corresponds to the second side surface $W_6$ of the wafer W. In addition, a second draining hole 256c is formed at an interior portion 256b of the second gripping groove 256a facing the second side surface $W_6$ of the wafer W. The second draining hole 256c penetrates the second holder 256 in a radial direction with respect to the wafer W. The first and the second cleaning solutions move toward the peripheral portion of the wafer W on the first and the second surfaces $W_1$ and $W_2$ of the wafer W, respectively, and then the first and the second cleaning solutions move toward the second holder and are discharged through the second draining hole 256c.

Figure 12:
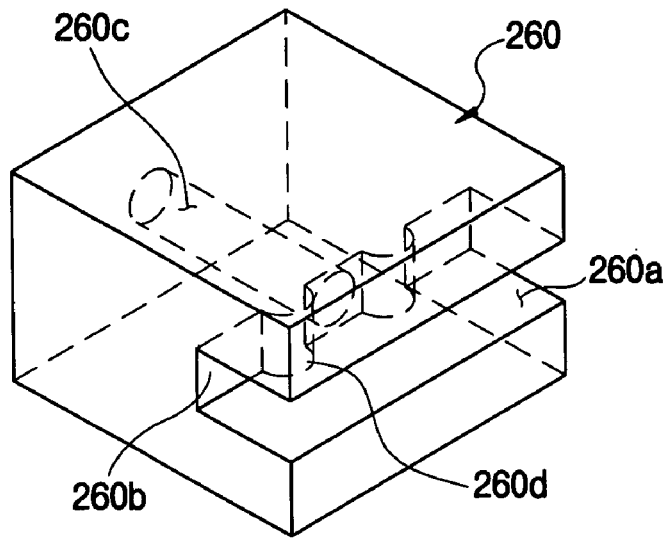
FIG. 12 illustrates an elevated, perspective view of an alternate embodiment of a holder as shown in FIG. 2.
Figure 13:
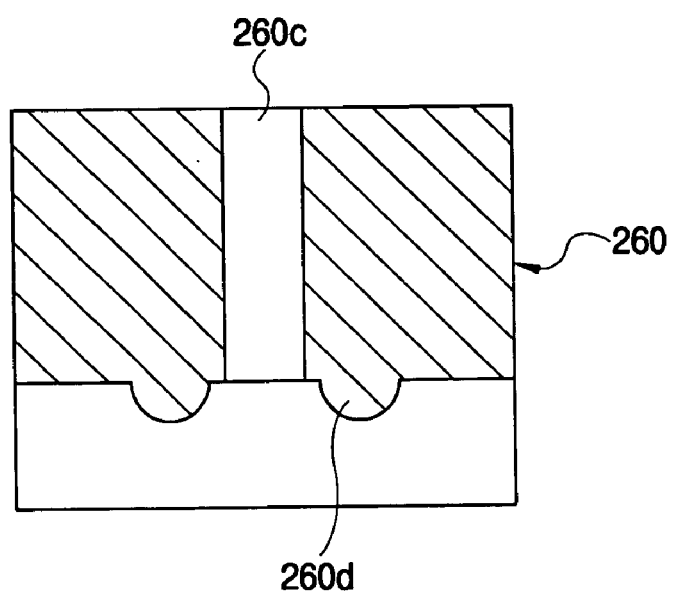
FIG. 13 illustrates a cross-sectional view of the holder as shown in FIG. 12.

FIG. 12 illustrates an elevated, perspective view of an alternate embodiment of a holder as shown in FIG. 2. FIG. 13 illustrates a cross-sectional view of the holder as shown in FIG. 12.

Referring to FIGS. 12 and 13, a holder 260 includes a gripping groove 260a for holding a peripheral portion of the wafer W. A draining hole 260c is formed at an interior portion 260b of the gripping groove 260a in order to discharge the first and the second cleaning solution dispersed from the first and the second surfaces $W_1$ and $W_2$ of the wafer W, respectively. In addition, two protruding portions 260d are formed at the interior portion 260b of the gripping groove 260a facing the side surface of the wafer W. The protruding portions 260d are tightly contacted to the side surface of the wafer W, and are disposed to either side of the draining hole 260b. The cross-sections of the protruding portions 260d have semicircular shapes in order to minimize the contact area between the protruding portions 260d and the side surface of the wafer W.

Figure 14:
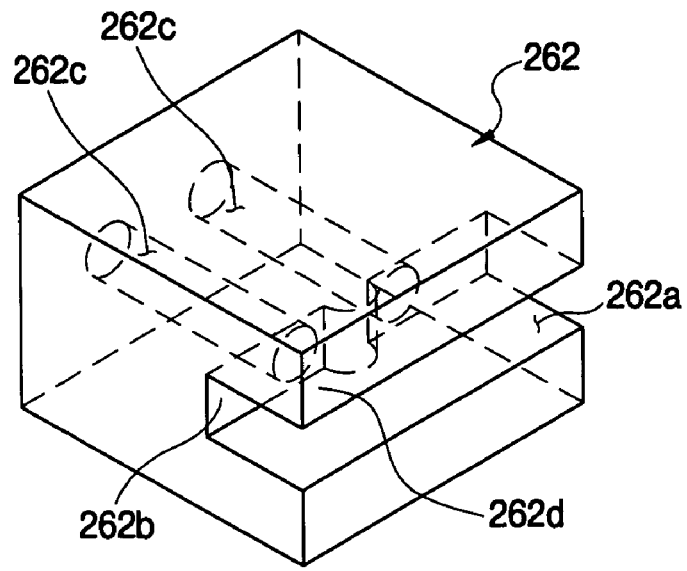
FIG. 14 illustrates an elevated, perspective view of still another alternate embodiment of a holder as shown in FIG. 2.
Figure 15:
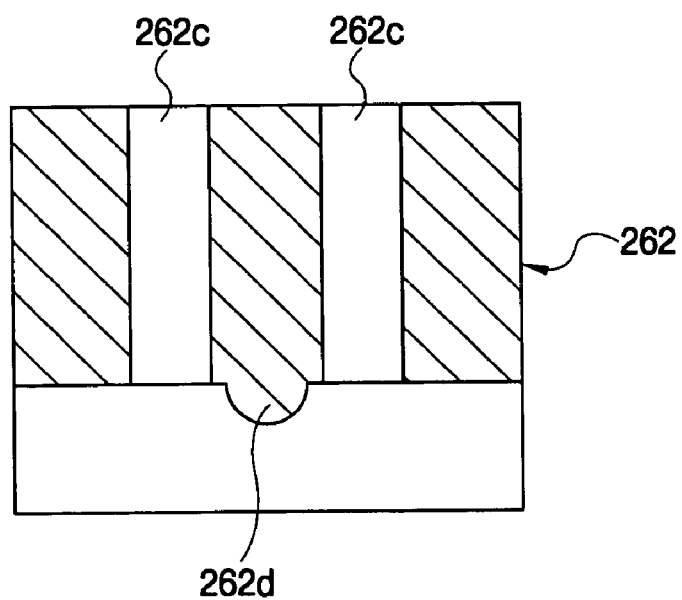
FIG. 15 illustrates a cross-sectional view of the holder as shown in FIG. 14.

FIG. 14 illustrates an elevated, perspective view of still another alternate embodiment of the holder as shown in FIG. 2. FIG. 15 illustrates a cross-sectional view of the holder as shown in FIG. 14.

Referring to FIGS. 14 and 15, a holder 262 includes a gripping groove 262a to contact and secure a peripheral portion of the wafer W. A protruding portion 262d having a semicircular shape is formed at a central portion of an interior portion 262b of the gripping groove 262a such that the protruding portion 262d is tightly contacted with the side of the wafer W. Two draining holes 262c are formed at the interior portion 262b of the gripping groove 262a to either side of the protruding portion 262d, thereby discharging the first and the second cleaning solutions run-off from the first and the second surfaces $W_1$ and $W_2$ of the wafer W, respectively. The draining holes 262c penetrate the holder 262 in a radial direction with respect to the wafer W.

Figure 16:
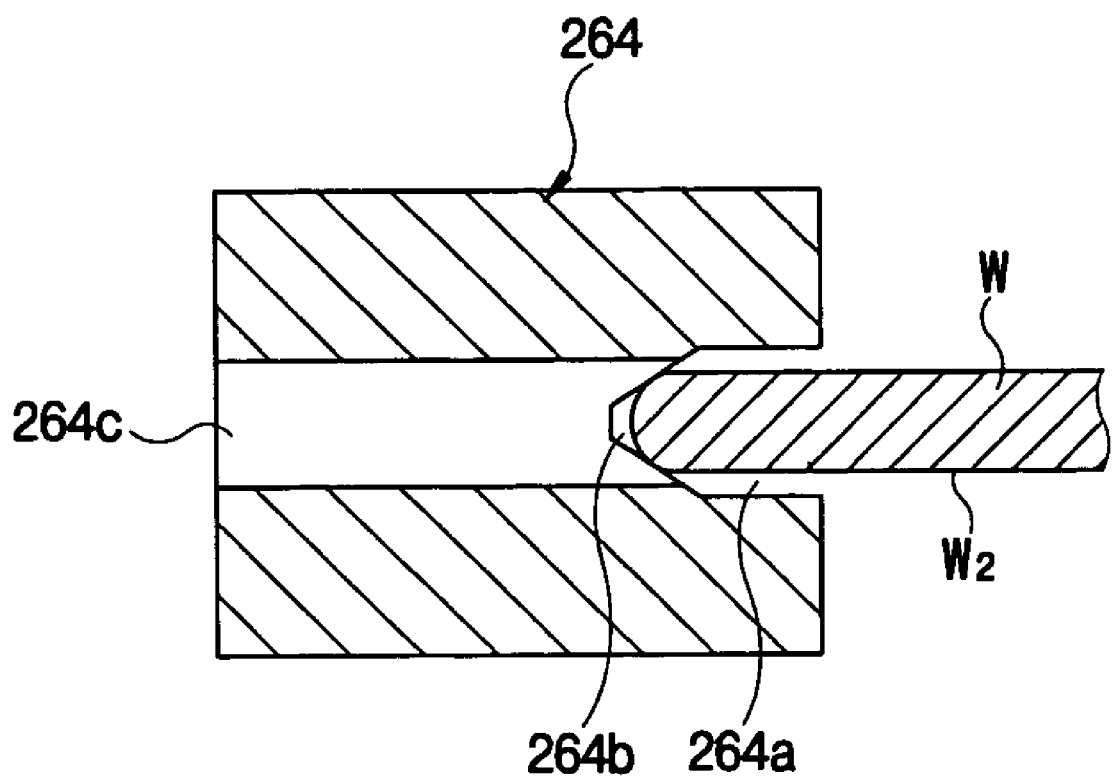
FIG. 16 illustrates a cross-sectional view of yet another alternate embodiment of a holder as shown in FIG. 2.

FIG. 16 illustrates a cross-sectional view of yet another alternate embodiment of a holder as shown in FIG. 2.

Referring to FIG. 16, a holder 264 includes a gripping groove 264a for contacting and securing a peripheral portion of the wafer. A draining hole 264c is formed at an interior portion of the gripping groove 264a in order to discharge the first and the second cleaning solutions. An insertion groove 264b is formed at the interior portion of the gripping groove 264a facing the side surface of the wafer W for receiving the peripheral portion of the wafer W. The cross-section of the insertion groove 264b has a shape of the letter "V" in order to minimize the contact area between the insertion groove 264b and the peripheral portion of the wafer W. In this embodiment, the second surface $W_2$ of the wafer W does not contact the bottom surface of the gripping groove 264a.

Referring back to FIG. 1, the wafer conveyer 110 is disposed in the wafer load chamber 100 for transferring the wafer W after it has been subjected to a CMP process. The wafer conveyer 110 includes two wire ropes in order to transfer the wafer W to a location where the holders 250 are able to contact and secure the wafer W.

A first gate 200b is formed at a first sidewall 200a of the processing chamber 200 disposed adjacent to the wafer load chamber 100. The first gate 200b serves as a passage for the holders 250 and the first plate 210 for loading the wafer W into the processing chamber 200. The first gate 200b is opened and closed by a first door 204a. A second gate 200d is formed at a second sidewall 200c of the processing chamber 200 for unloading the wafer W from the processing chamber 200. A second door 204b is provided for opening and closing the second gate 200d.

To load and unload the wafer W, the sixth driving part 280 transfers the holders 250 and the first plate 210 from the wafer load chamber 100 into the processing chamber 200. Then, the sixth driving part 280 moves the holders 250 and the first plate 210 from the processing chamber 200 into the wafer unload chamber 300.

The sixth driving part 280 includes a ball guide 282, a ball screw 284, a motor 286, and a ball block 288. The ball guide 282 extends from the wafer load chamber 100 to the wafer unload chamber 300 through the processing chamber 200, and the ball screw 284 is installed in the ball guide 282. The motor 286 is connected to the ball screw 284 to provide the ball screw 284 with a rotational force. The ball block 288 is coupled to the ball guide 282 to slidably move. The ball block 288 connects the ball screw 284 to the fifth driving part 238. In addition, the ball block 288 linearly reciprocates between the wafer load chamber 100 and the wafer unload chamber 300 by the rotational force provided from the motor 286.

The cassette stage 310 and the transferring robot 320 are disposed in the wafer unload chamber 300. The cassette stage 310 supports the wafer cassette 302, and the transferring robot 320 transfers the cleaned and dried wafer W into the wafer cassette 302.

The seventh driving part 312 is connected to a bottom surface of the cassette stage 310 to raise and lower the cassette stage 310. The transferring robot 320 transfers the wafer W from the holders 250 moved into the wafer unload chamber 300 to wafer cassette 302. At that time, the transferring robot 320 linearly reciprocates in the horizontal direction, and also the transferring robot 320 rotates in order to position the wafer W into the wafer cassette 302.

While the seventh driving part 312 raises and lowers the wafer cassette 302, and the transferring robot 320 rotates and linearly reciprocates in the horizontal direction, the cassette stage 310 for supporting the wafer cassette 302 is fixed.

The transferring robot 320 may directly transfer a wafer W from the processing chamber 200 to the wafer cassette 302 of the unload chamber.

In addition, the wafer cleaning apparatus 10 includes a draining pipe 290 connected to the center of the bottom portion of the processing chamber 200 for discharging the first and the second cleaning solutions used for cleaning the wafer W. A bottom surface of the processing chamber 200 is inclined toward a center thereof to facilitate discharge of the first and the second cleaning solutions. The draining pipe 290 includes a first draining tube 292 for discharging de-ionized water, and a second draining tube 294 for discharging chemicals. An exhausting pipe 296 is connected to an upper portion of the processing chamber 200 to exhaust the first and the second drying gases used for drying the wafer W.

Figure 17:
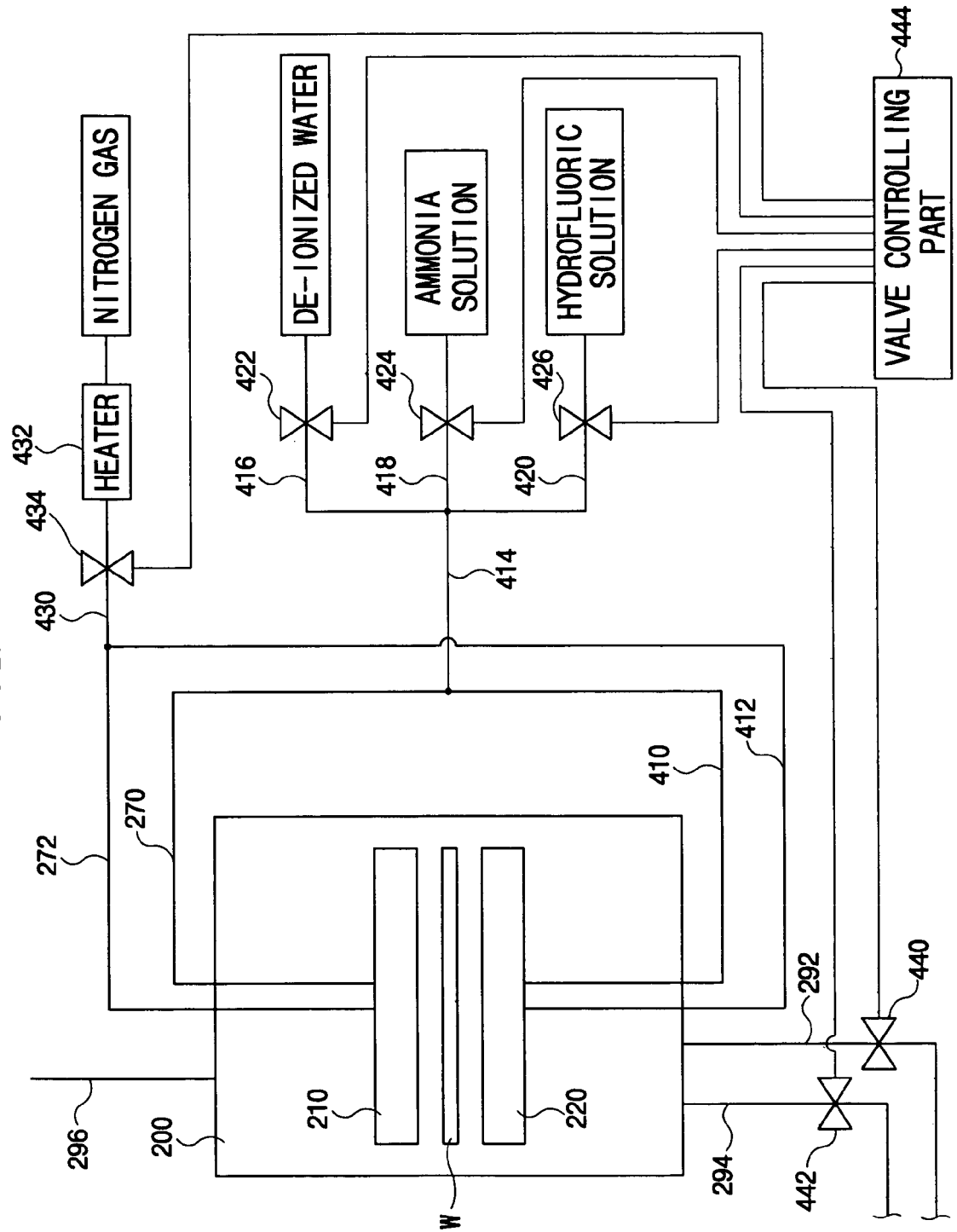
FIG. 17 illustrates a schematic block diagram of a line for supplying the cleaning solutions and the drying gases to the wafer cleaning apparatus as shown in FIG. 1.

FIG. 17 illustrates a schematic block diagram of a line for supplying the cleaning solutions and the drying gases to the wafer cleaning apparatus in FIG. 1.

Referring to FIG. 17, the wafer W is positioned between the first plate 210 and the second plate 220 in the processing chamber 200. A first cleaning solution supplying line 270 and a first drying gas supplying line 272 are connected to the first plate 210 for supplying the first plate 210 with the first cleaning solution and the first drying gas, respectively. A second cleaning solution supplying line 410 and a second drying gas supplying line 412 are connected to the second plate 220 in order to supply the second plate 210 with the second cleaning solution and the second drying gas, respectively.

The first and the second cleaning solution supplying lines 270 and 410 converge to a single cleaning solution supplying line 414, and the cleaning solution supplying line 414 is connected to a de-ionized water supplying line 416, an ammonia solution supplying line 418, and a hydrofluoric solution supplying line 420.

A first control valve 422 is installed in the de-ionized water supplying line 416 to control the flow rate of the de-ionized water. A second control valve 424 is installed in the ammonia solution supplying line 418 to control the flow rate of the ammonia solution. A third control valve 426 is installed in the hydrofluoric solution supplying line 420 to control the flow rate of the hydrofluoric solution.

The first and the second drying gas supplying lines 272 and 412 converge to a single drying gas supplying line 430, and the drying gas supplying line 430 is connected to a heater 432 for heating a nitrogen gas. A fourth control valve 434 is installed in the drying gas supplying line 430 to control the flow rate of the nitrogen gas heated by the heater 432.

A fifth control valve 440 and a sixth control valve 442 are installed in the first and the second draining tubes 292 and 294, respectively, which are connected to the bottom surface of the processing chamber 200.

The first through sixth control valves 422, 424, 426, 434, 440 and 442 are connected to a valve controlling part 444. Solenoid valves may be employed as the first through sixth control valves 422, 424, 426, 434, 440 and 442, respectively.

As shown in FIG. 17, the first cleaning solution provided from the first plate 210 is identical to the second cleaning solution applied from the second plate 220. However, when, in an alternate embodiment, the first cleaning solution is different from the second cleaning solution for cleaning the first and the second surfaces $W_1$ and $W_2$ of the wafer W in accordance with the processing conditions of the cleaning process, the line for supplying the cleaning solutions and the drying gases may be constructed as illustrated in FIG. 18.

Figure 18:
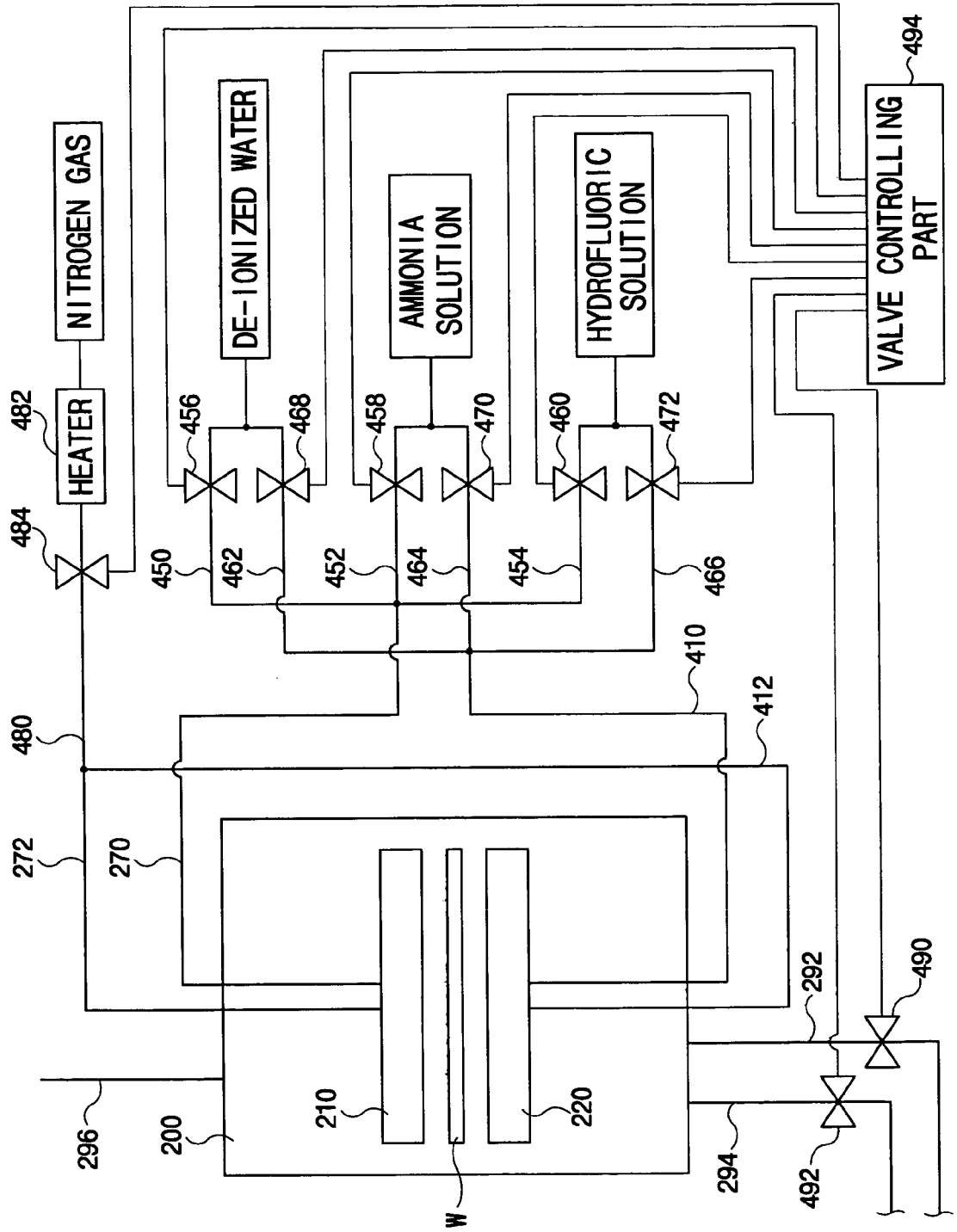
FIG. 18 illustrates a schematic block diagram of an alternate embodiment of a line for supplying the cleaning solutions and the drying gases to the wafer cleaning apparatus as shown in FIG. 1.

FIG. 18 illustrates a schematic block diagram of an alternate embodiment of the line for supplying the cleaning solutions and the drying gases to the wafer cleaning apparatus as shown in FIG. 1.

Referring to FIG. 18, a first cleaning solution supplying line 270 is connected to a first de-ionized water supplying line 450, a first ammonia solution supplying line 452, and a first hydrofluoric solution supplying line 454. A first control valve 456 is installed in the first de-ionized water supplying line 450 to control the flow rate of the de-ionized water to the first plate 210. A second control valve 458 is installed in the first ammonia solution supplying line 452 to control the flow rate of the ammonia solution to the first plate 210. A third control valve 460 is installed in the first hydrofluoric solution supplying line 454 to control the flow rate of the hydrofluoric solution to the first plate 210.

A second cleaning solution supplying line 410 is connected to a second de-ionized water supplying line 462, a second ammonia solution supplying line 464, and a second hydrofluoric solution supplying line 466. A fourth control valve 468 is installed in the second de-ionized water supplying line 462 to control the flow rate of the de-ionized water to the second plate 220. A fifth control valve 470 is installed in the second ammonia solution supplying line 464 to control the flow rate of the ammonia solution to the second plate 220. A sixth control valve 472 is installed in the second hydrofluoric solution supplying line 466 to control the flow rate of the hydrofluoric solution to the second plate 220.

A first and a second drying gas supplying lines 272 and 412 converge to a single drying gas supplying line 480, and the drying gas supplying line 480 is connected to a heater 482 for heating a nitrogen gas. A seventh control valve 484 is installed in the drying gas supplying line 480 to control the flow rate of the nitrogen gas heated by the heater 482.

An eighth control valve 490 and a ninth control valve 492 are installed in the first and the second draining tubes 292 and 294, respectively, which are connected to the bottom surface of the processing chamber 200.

The first through ninth control valves 456, 458, 460, 468, 470, 472, 484, 490 and 492 are connected to a valve controlling part 494. Solenoid valves may be employed as the first through ninth control valves 456, 458, 460, 468, 470, 472, 484, 490 and 492, respectively.

Hereinafter, a method for cleaning a wafer according to an embodiment of the present invention will be described with reference to the accompanying drawings.

After the wafer W has been subjected to a CMP process, the wafer W is transferred to the wafer load chamber 100 by the wafer conveyer 110.

The sixth driving part 280 transfers the first plate 210 and the holders 250 into the wafer load chamber 100 for loading the wafer W. The fifth driving part 238 lowers the first plate 210 and the holders 250 for holding the wafer W.

The fourth driving part 236 downwardly swings the holders 250 to contact and secure the peripheral portions of the wafer W, and the fifth driving part 238 raises the first plate 210 and the holders 250 holding the wafer W.

The sixth driving part 280 transfers the wafer W secured by the holders 250 into the processing chamber 200, the fifth driving part 238 lowers the first plate 210 and the holders 250 gripping the wafer W to adjust the distance interval between the second plate 220 and the wafer W. The fourth driving part 236 is able to adjust the distance interval between the first plate 210 and the wafer W secured by the holders 250. Preferably, the distance interval between the first and the second plates 210 and 220 is approximately 5 cm.

The third driving part 234 then rotates the wafer W secured by the holders 250, and de-ionized water is sprayed from the first and the second plates 210 and 220 onto the first and the second surfaces $W_1$ and $W_2$ of the wafer W, respectively, which is secured by the holders 250. At that time, the wafer W rotates at a rotational speed of approximately 60 rpm, and a pressure for supplying the de-ionized water is approximately 4 $kg/cm^2$. The first and the second plates 210 and 220 do not rotate. To improve the efficiency of the cleaning process for the wafer W, however, the first and the second plates 210 and 220 may rotate in a direction opposite to the direction of rotation of the wafer W.

Next, the ammonia solution is sprayed onto the wafer W from the first and the second plates 210 and 220 to change a surface characteristic of the wafer W to hydrophilic. At this time, the wafer W rotates in a first direction while the first and the second plates 210 and 220 rotate in a second direction. The first direction indicates the rotational direction of the wafer W, as shown in FIG. 1, and the second direction, which is opposite to the first direction, indicates the rotational direction of the first and the second plates 210 and 220, as shown in FIG. 1. The wafer W rotates at a rotational speed of approximately 60 rpm, and the first and the second plates 210 and 220 rotate at a rotational speed of approximately 200 rpm. Additionally, a pressure for supplying the ammonia solution is approximately 4 $kg/cm^2$, and a time for supplying the ammonia solution is approximately 5 seconds. Thus, the ammonia solution is sprayed onto the surface of the wafer W for about 5 seconds while the wafer W rotates in the second direction, and the first and the second plates 210 and 220 rotate in the first direction. In the case that the rotational directions of the wafer W, the first plate 210 and the second plate 220 are opposite as described above, the surface characteristic of the wafer W may be more rapidly changed to hydrophilic.

Then, de-ionized water is sprayed onto the first and the second surfaces $W_1$ and $W_2$ of the wafer W from the first and the second plates 210 and 220 for approximately 20 seconds to remove the ammonia solution remaining on the surface of the wafer W. At that time, the wafer W rotates in the second direction at a rotational speed of approximately 60 rpm, and the first and the second plates 210 and 220 rotate in the first direction at a rotational speed of approximately 200 rpm.

Next, the hydrofluoric solution is sprayed from the first and the second plates 210 and 220 onto the first and the second surfaces $W_1$ and $W_2$ of the wafer W, which are presently hydrophilic. The hydrofluoric solution reacts with the slurry and the polished by-products remaining on the surface of the wafer W so that the slurry and the polished by-products are removed from the wafer W. At this time, a pressure for supplying the hydrofluoric solution is approximately 4 $kg/cm^2$, and a time for spraying the hydrofluoric solution is approximately 30 seconds. The wafer W rotates in the second direction at a rotational speed of approximately 60 rpm, and the first and the second plates 210 and 220 rotate in the first direction at a rotational speed of approximately 200 rpm.

The hydrofluoric solution is also sprayed onto the first and the second surfaces $W_1$ and $W_2$ of the wafer W while the wafer W rotates in the first direction, and the first and the second plate 210 and 220 rotate in the second direction. When the rotational directions of the wafer W and the first plate 210 and the second plate 220 are opposite, the efficiency of the process for cleaning the wafer W is enhanced.

After the cleaning solutions are spayed from the first and the second plates 210 and 220 onto the first and the second surfaces $W_1$ and $W_2$ of the wafer W, the cleaning solutions more rapidly flow on the first and the second surfaces $W_1$ and $W_2$ of the wafer W. Thus, the frictional force between the surfaces $W_1$ and $W_2$ of the wafer W and the cleaning solutions increases, thereby improving the cleaning efficiency of the wafer W.

The de-ionized water is then sprayed from the first and the second plates 210 and 220 for about 20 seconds onto the first and the second surfaces $W_1$ and $W_2$ of the wafer W, which have been cleaned with the hydrofluoric solution. At this time, the wafer W rotates in the first direction at a rotational speed of approximately 60 rpm, and the first and the second plates 210 and 220 rotate in the second direction at a rotational speed of approximately 200 rpm.

After the first and the second plates 210 and 220 stop rotating in the second direction, de-ionized water is provided onto the wafer W and the wafer W rotates in the first direction to perform a final rinsing process for the wafer W.

Primary drying of the wafer W occurs while the wafer W rotates at a rotational speed of approximately 500 rpm for about 30 seconds. In addition, at that time the first and the second plates 210 and 220 apply heated nitrogen gases onto the first and the second surfaces $W_1$ and $W_2$ of the wafer W, respectively. The heated nitrogen gas has a temperature of approximately 40° C., and a pressure for applying the nitrogen gas is approximately 1 $kg/cm^2$.

Secondary drying of the wafer W occurs by rotating the wafer W at a rotational speed of approximately 100 rpm for about 5 seconds. In this case, the first and the second plates 210 and 220 spray nitrogen gases having a temperature of approximately 80° C. onto the wafer W. A pressure for supplying the nitrogen gas is approximately 2 kg/cm$^2$.

Tertiary drying of the wafer W occurs by rotating the wafer W at a rotational speed of approximately 200 rpm for about 20 seconds. At that time, the first and the second plates 210 and 220 spray nitrogen gases having a temperature of approximately 100° C. onto the wafer W, and a pressure for supplying the nitrogen gas is approximately 3 kg/cm$^2$.

Subsequently, the fifth driving part 238 raises the first plate 210 and the holders 250 holding the dried wafer W, and the sixth driving part 280 transfers the first plate 210 and the holders 250 securing the wafer W into the wafer unload chamber 300.

The fourth driving part 236 upwardly swings the holders 250 securing the peripheral portions of the wafer W, and the transferring robot 320 supports the wafer W. The transferring robot 320 transfers the wafer W into the wafer cassette 302. At this time, the height of the wafer cassette 302 is adjusted by the seventh driving part 312.

In the foregoing detailed description, several exemplary values for process conditions, such as the rotation speed and direction of the wafer W, the rotational speeds and directions of the first and the second plates 210 and 220, the types of the cleaning solutions and the drying gases, the pressures for supplying the cleaning solutions and the drying gases, temperatures, the process times of the processes for cleaning the wafer W, and the like have been provided. It must be noted, however, that these parameters are merely exemplary and may be varied in accordance with particular processing conditions of the cleaning process and the type of the objects to be rinsed.

According to the present invention, the first and the second plates provide the first and the second surfaces of the wafer with the first and the second cleaning solutions while the rotational directions of the first and the second plates are opposite to that of the wafer. The nozzles formed through the first and the second plates are inclined toward the peripheral portion of the wafer, and the nozzles have cross-sectional areas gradually reduced from the central portions of the plates to the peripheral portions of the plates. The rotations of the wafer, the first plate and the second plate together cause the abrupt flows of the cleaning solutions provided on the first and the second surfaces of the wafer. Therefore, the abrupt flows of the cleaning solutions can increase a frictional force between the plates and the surfaces of the wafer so that the efficiency of the cleaning process may be greatly improved.

Further, the nozzles are radially disposed, and the longitudinal cross-sectional areas of the nozzles are increased toward the surface of the wafer. Thus, the cleaning solutions and the drying gases can be uniformly provided onto the surface of the wafer, thereby improving the efficiencies of the cleaning and the drying processes.

Furthermore, the time required for cleaning and the drying the wafer may be significantly reduced because several cleaning and drying processes can be executed in a single processing chamber.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for cleaning a wafer, comprising:
   a processing chamber for performing a cleaning process;
   a wafer load chamber for loading the wafer, the wafer load chamber connected to a first sidewall of the processing chamber;
   a wafer unload chamber connected to a second sidewall of the processing chamber;
   a plurality of holders for contacting and securing peripheral portions of the wafer, and for rotating the wafer;
   a first plate disposed to face a first surface of the wafer, the first plate having a plurality of first nozzles for spraying a first cleaning solution onto the first surface of the wafer; and
   a second plate installed in the processing chamber and disposed to face a second surface of the wafer that is opposite to the first surface, the second plate having a plurality of second nozzles for spraying a second cleaning solution onto the second surface of the wafer,
   wherein the holders and the first plate are connected to each other, and the holders and the first plate move from the wafer load chamber into the processing chamber to load the wafer and move from the processing chamber into the wafer unload chamber to unload the wafer.

2. The apparatus for cleaning a wafer as claimed in claim 1, wherein the first plate has a disc shape corresponding to a shape of the wafer, and the plurality of first nozzles are radially disposed.

3. The apparatus for cleaning a wafer as claimed in claim 2, wherein cross-sectional areas of the plurality of first nozzles gradually decrease from a central first nozzle located at a central portion of the first plate to one of the plurality of first nozzles located at a peripheral portion of the first plate.

4. The apparatus for cleaning a wafer as claimed in claim 3, wherein the second plate has a disc shape corresponding to a shape of the wafer, and the plurality of second nozzles are radially disposed.

5. The apparatus for cleaning a wafer as claimed in claim 4, wherein cross-sectional areas of the plurality of second nozzles gradually decrease from a central second nozzle located at a central portion of the second plate to one of the plurality of second nozzles located at a peripheral portion of the second plate.

6. The apparatus for cleaning a wafer as claimed in claim 1, wherein a first passage is formed in the first plate for connecting the plurality of first nozzles, and the first passage is connected to a first cleaning solution supplying line for supplying the first cleaning solution.

7. The apparatus for cleaning a wafer as claimed in claim 1, wherein a second passage is formed in the second plate for connecting the plurality of second nozzles, and the second passage is connected to a second cleaning solution supplying line for supplying the second cleaning solution.

8. The apparatus for cleaning a wafer as claimed in claim 1, wherein a cross-sectional area of each of the plurality of first nozzles and each of the plurality of second nozzles gradually increases toward the wafer in a longitudinal direction.

9. The apparatus for cleaning a wafer as claimed in claim 1, wherein each of the plurality of first nozzles located away from a center of the first plate and each of the plurality of second nozzles located away from a center of the second plate are inclined toward the peripheral portion of the wafer.

10. The apparatus for cleaning a wafer as claimed in claim 1, wherein the first plate further comprises:
a plurality of third nozzles for spraying a first drying gas onto the first surface of the wafer cleaned with the first cleaning solution, and a third passage for connecting the plurality of third nozzles, the third passage being connected to a first drying gas supplying line for supplying the first drying gas.

11. The apparatus for cleaning a wafer of claim 1, wherein the plurality of holders comprises:
a first holder disposed at a location corresponding to a flat zone portion of the wafer and a plurality of second holders disposed at a location corresponding to a circumferential portion of the wafer, the first holder including a first gripping groove corresponding to the flat zone portion of the wafer, and each of the plurality of second holders including second gripping grooves corresponding to the circumferential portions of the wafer.

12. The apparatus for cleaning a wafer as claimed in claim 11, wherein the first holder further includes a first draining hole for discharging the first and the second cleaning solutions moving toward the first holder due to a rotation of the wafer after the first and the second cleaning solutions are provided onto the wafer, the first draining hole penetrating an interior portion of the first gripping groove facing a first side of the flat zone portion of the wafer and extending in a radial direction with respect to the wafer; and
each of the plurality of second holders further includes a second draining hole for discharging the first and the second cleaning solutions moving toward the plurality of second holders due to the rotation of the wafer after the first and the second cleaning solutions are provided onto the wafer, each of the second draining holes penetrating interior portions of each of the plurality of second gripping grooves facing a second side surface of the circumferential portion of the wafer and extending in the radial direction with respect to the wafer.

13. The apparatus for cleaning a wafer as claimed in claim 1, wherein each of the holders comprises:
a gripping groove for gripping securing the peripheral portion of the wafer, and a protruding portion for contacting a side surface of the wafer, the protruding portion being formed at interior portion of the gripping groove facing the side surface of the wafer.

14. The apparatus for cleaning a wafer as claimed in claim 13, wherein each of the holders further comprises:
a draining hole for discharging the first and the second cleaning solutions moving toward the holders due to a rotation of the wafer after the first and the second cleaning solutions are provided onto the wafer, the draining hole penetrating the interior portion of the gripping groove in a radial direction with respect to the wafer.

15. The apparatus for cleaning a wafer as claimed in claim 14, wherein the protruding portion is two protrusions extending from the interior portion of the gripping groove, the two protrusions being disposed one on either side of the draining hole.

16. The apparatus for cleaning a wafer as claimed in claim 15, wherein the two protrusions have a semicircular shape.

17. The apparatus for cleaning a wafer as claimed in claim 14, wherein the draining hole is two draining holes penetrating the interior portion of the gripping grove, the two draining holes being disposed one on either side of the protruding portion.

18. The apparatus for cleaning a wafer as claimed in claim 17, wherein the protruding portion has a semicircular shape.

19. The apparatus for cleaning a wafer as claimed in claim 1, wherein each of the holders includes a gripping groove for gripping the peripheral portion of the wafer, and an insertion groove for receiving the peripheral portion of the wafer, the insertion groove being formed at interior portion of the gripping groove facing with a side surface of the wafer.

20. The apparatus for cleaning a wafer as claimed in claim 19, wherein the insertion groove has a shape of the letter "V."

21. The apparatus for cleaning a wafer as claimed in claim 1, further comprising:
a first driving part for rotating the wafer;
a second driving part for swinging the plurality of holders toward the peripheral portion of the wafer so that the plurality of holders can contact and secure the peripheral portion of the wafer;
a plurality of connecting rods for connecting the second driving part to the plurality of holders;
a third driving part for lowering and raising the holders and the first plate; and
a fourth driving part for transferring the holders and the first plate from the wafer load chamber to the wafer unload chamber through the processing chamber to load and unload the wafer,
wherein the third driving part includes:
a ball guide extending from the wafer load chamber into the wafer unload chamber through the processing chamber;
a ball screw installed in the ball guide;
a motor connected to the ball screw for providing a rotational force; and
a ball block slidably combined with the ball guide for connecting the first driving part to the ball screw, the ball block linearly reciprocating due to the rotational force of the motor.

22. The apparatus for cleaning a wafer as claimed in claim 1, further comprising:
a first driving part for rotating the first plate in a direction opposite to a rotational direction of the wafer;
a first driving shaft for connecting the first plate to the first driving part;
a second driving part for rotating the second plate in a direction opposite to the rotational direction of the wafer; and
a second driving shaft for connecting the second plate to the second driving part.

23. The apparatus for cleaning a wafer as claimed in claim 1, further comprising:
a first driving part for moving the holders to adjust a distance interval between the first plate and the wafer secured by the plurality of holders; and
a second driving part for moving the first plate to adjust a distance interval between the first plate and the second plate.

24. An apparatus for cleaning a wafer, comprising:
a processing chamber for performing a cleaning process;
a wafer load chamber for loading the wafer, the wafer load chamber connected to a first sidewall of the processing chamber;
a wafer unload chamber connected to a second sidewall of the processing chamber;
a plurality of holders for gripping peripheral portions of a wafer;
a first plate disposed to face a first surface of the wafer and connected to the holders, the first plate having a disc shape corresponding to a shape of the wafer and a plurality of first nozzles for spraying a first cleaning solution on the first surface of the wafer;

a second plate disposed to face a second surface of the wafer that is opposite to the first surface of the wafer, the second plate having a disc shape corresponding to a shape of the wafer and a plurality of second nozzles for spraying a second cleaning solution on the second surface of the wafer;

a first driving part connected to the first plate for rotating the first plate in a first direction;

a second driving part connected to the second plate for rotating the second plate in the first direction;

a third driving part connected to the plurality of holders for rotating the wafer secured by the plurality of holders in a second direction, which is opposite to the first direction;

a fourth driving part for swinging the plurality of holders toward the peripheral portions of the wafer so that the plurality of holders can contact and secure the peripheral portions of the wafer;

a fifth driving part for lowering and raising the holders and the first plate; and a sixth driving part for transferring the holders and the first plate from the wafer load chamber to the wafer unload chamber through the processing chamber to load and unload the wafer.

25. An apparatus for cleaning a wafer, comprising:

a first plate having a plurality of first nozzles for spraying a first cleaning solution onto a first surface of a wafer;

a plurality of holders for contacting and securing peripheral portions of the wafer to face the first plate, and for rotating the wafer, the holders being connected to the first plate;

a second plate having a plurality of second nozzles for spraying a second cleaning solution onto a second surface of the wafer, the second plate being disposed to face the second surface of the wafer;

a first driving part connected to the plurality of holders for swinging the plurality of holders toward the peripheral portions of the wafer so that the plurality of holders can contact and secure the peripheral portions of the wafer;

a second driving part connected to the first driving part for rotating the wafer secured by the plurality of holders;

transferring means for transferring the wafer treated with the first and the second cleaning solutions into a wafer cassette;

a cassette stage for supporting the wafer cassette;

a processing chamber for performing a cleaning process using the first and second cleaning solutions;

a wafer load chamber for loading the wafer, the wafer load chamber connected to a first sidewall of the processing chamber;

a wafer unload chamber connected to a second sidewall of the processing chamber, the transferring means and the cassette stage being installed in the wafer unload chamber; and a third driving part for moving the first plate and the plurality of holders into the processing chamber in order to load the wafer, and for moving the cleaned wafer from the processing chamber into the wafer unload chamber.

26. The apparatus for cleaning a wafer as claimed in claim 25, wherein the third driving part comprises:

a ball guide extending from the wafer load chamber into the wafer unload chamber through the processing chamber;

a ball screw installed in the ball guide;

a motor connected to the ball screw for providing a rotational force; and a ball block slidably combined with the ball guide for connecting the first driving part to the ball screw, the ball block linearly reciprocating due to the rotational force of the motor.

27. The apparatus for cleaning a wafer as claimed in claim 25, further comprising:

a fourth driving part connected to the first plate for rotating the first plate in a direction opposite to a rotational direction of the wafer; and a fifth driving part connected to the second plate for rotating the second plate in a direction opposite to the rotational direction of the wafer.

28. The apparatus for cleaning a wafer as claimed in claim 25, further comprising:

a fourth driving part connected to the cassette stage for upwardly and downwardly moving the cassette stage.

29. The apparatus for cleaning a wafer as claimed in claim 28, wherein the transferring means comprises:

a transferring robot that rotates and linearly reciprocates in a horizontal direction for transferring the cleaned wafer into the wafer cassette.

30. The apparatus for cleaning a wafer as claimed in claim 25, wherein the transferring means comprises:

a transferring robot that rotates and linearly reciprocates in a horizontal direction and a vertical direction for transferring the rinsed wafer into the wafer cassette.

* * * * *